United States Patent
Pfaff et al.

(10) Patent No.: US 12,155,509 B1
(45) Date of Patent: Nov. 26, 2024

(54) CONTINUOUS TIME LINEAR EQUALIZER WITH PROGRAMMABLE INDUCTIVE HIGH FREQUENCY BOOST

(71) Applicant: Synopsys, Inc., Sunnyvale, CA (US)

(72) Inventors: Dirk Pfaff, Ottawa (CA); Jingjing Xia, Breslau (CA); David A. Yokoyama-Martin, Portland, OR (US)

(73) Assignee: Synopsys, Inc., Sunnyvale, CA (US)

( * ) Notice: Subject to any disclaimer, the term of this patent is extended or adjusted under 35 U.S.C. 154(b) by 56 days.

(21) Appl. No.: 18/204,807

(22) Filed: Jun. 1, 2023

(51) Int. Cl.
*H04L 25/03* (2006.01)
*H03G 5/16* (2006.01)

(52) U.S. Cl.
CPC ....... *H04L 25/03019* (2013.01); *H03G 5/165* (2013.01)

(58) Field of Classification Search
CPC ................. H04L 25/03019; H03G 5/165
See application file for complete search history.

(56) References Cited

U.S. PATENT DOCUMENTS

| | | | | |
|---|---|---|---|---|
| 3,743,975 | A * | 7/1973 | Kao | H04B 3/141 |
| | | | | 375/232 |
| 11,489,705 | B1* | 11/2022 | Casey | H04L 25/03038 |
| 2012/0121004 | A1* | 5/2012 | Chang | H03H 7/40 |
| | | | | 375/232 |
| 2021/0359884 | A1* | 11/2021 | Delshadpour | H03F 1/42 |
| 2024/0305389 | A1* | 9/2024 | Abouzied | H03G 3/3042 |

* cited by examiner

*Primary Examiner* — Freshteh N Aghdam
(74) *Attorney, Agent, or Firm* — Patterson + Sheridan, LLP

(57) ABSTRACT

A communication system includes a receiver device having a continuous time linear equalizer circuitry. The continuous time linear equalizer circuitry includes first gain circuitry, second gain circuitry, second gain circuitry a first capacitor, a first resistive element, a first inductor, and a second resistive element. The first gain circuitry and the second gain circuitry receive an input signal. The first capacitor is connected between an output of the first gain circuitry and an output of the second gain circuitry. The first resistive element is connected between the output of the first gain circuitry and the output of the second gain circuitry. The first inductor is connected to the output of the first gain circuitry, the first capacitor, and the first resistive element. The second resistive element is connected in parallel with the first inductor.

20 Claims, 4 Drawing Sheets

CONTINUOUS TIME LINEAR EQUALIZER WITH PROGRAMMABLE INDUCTIVE HIGH FREQUENCY BOOST

TECHNICAL FIELD

The present disclosure relates to continuous time equalizer circuitry including a programmable inductive high frequency boost that is generated via an inductor and a programmable resistive element.

BACKGROUND

Data receivers (e.g., wireline or wireless data receivers) include analog to digital converter (ADC) circuitry and signal processing circuitry. In such data receivers, the majority of the filtering is performed in the digital domain, but high frequency analog signal emphasis is applied to the received signal prior to analog to digital conversion. Data receivers (e.g., receiver devices) include continuous time linear equalizer (CTLE) circuitry. The CTLE contains circuitry to mitigate signal loss and distortion within the received signal that are caused by a high frequency channel. A data receiver includes analog front-end circuitry that includes one or more cascaded CTLE circuits that are used to condition a received signal, mitigating signal loss and/or distortion.

SUMMARY

In one example, a continuous time linear equalizer circuitry includes first gain circuitry, second gain circuitry, second gain circuitry a first capacitor, a first resistive element, a first inductor, and a second resistive element. The first gain circuitry and the second gain circuitry receive an input signal. The first capacitor is connected between an output of the first gain circuitry and an output of the second gain circuitry. The first resistive element is connected between the output of the first gain circuitry and the output of the second gain circuitry. The first inductor is connected to the output of the first gain circuitry, the first capacitor, and the first resistive element. The second resistive element is connected in parallel with the first inductor.

In one example, an analog front-end circuitry includes a first continuous time linear equalizer circuitry. The first continuous time linear equalizer circuitry includes first gain circuitry, second gain circuitry, a first capacitor, a first resistive element, a first inductor, and a second resistive element. The first gain circuitry and the second gain circuitry receive an input signal. The first capacitor is connected between an output of the first gain circuitry and an output of the second gain circuitry. The first resistive element is connected between the output of the first gain circuitry and the output of the second gain circuitry. The first inductor is connected to the output of the first gain circuitry, the first capacitor, and the first resistive element. The second resistive element is connected in parallel with the first inductor.

In one example, a communication system includes a transmitter device and a receiver device. The transmitter device outputs a first signal. The receiver device receives the first signal from the transmitter device. The receiver device comprises analog front-end circuitry. The analog front-end circuitry comprises first continuous time linear equalizer circuitry. The first continuous time linear circuitry includes first gain circuitry, second gain circuitry, a first capacitor, a first resistive element, a first inductor, and a second resistive element. The first gain circuitry and the second gain circuitry receive an input signal. The first capacitor is connected between an output of the first gain circuitry and an output of the second gain circuitry. The first resistive element is connected between the output of the first gain circuitry and the output of the second gain circuitry. The first inductor is connected to the output of the first gain circuitry, the first capacitor, and the first resistive element. The second resistive element is connected in parallel with the first inductor.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
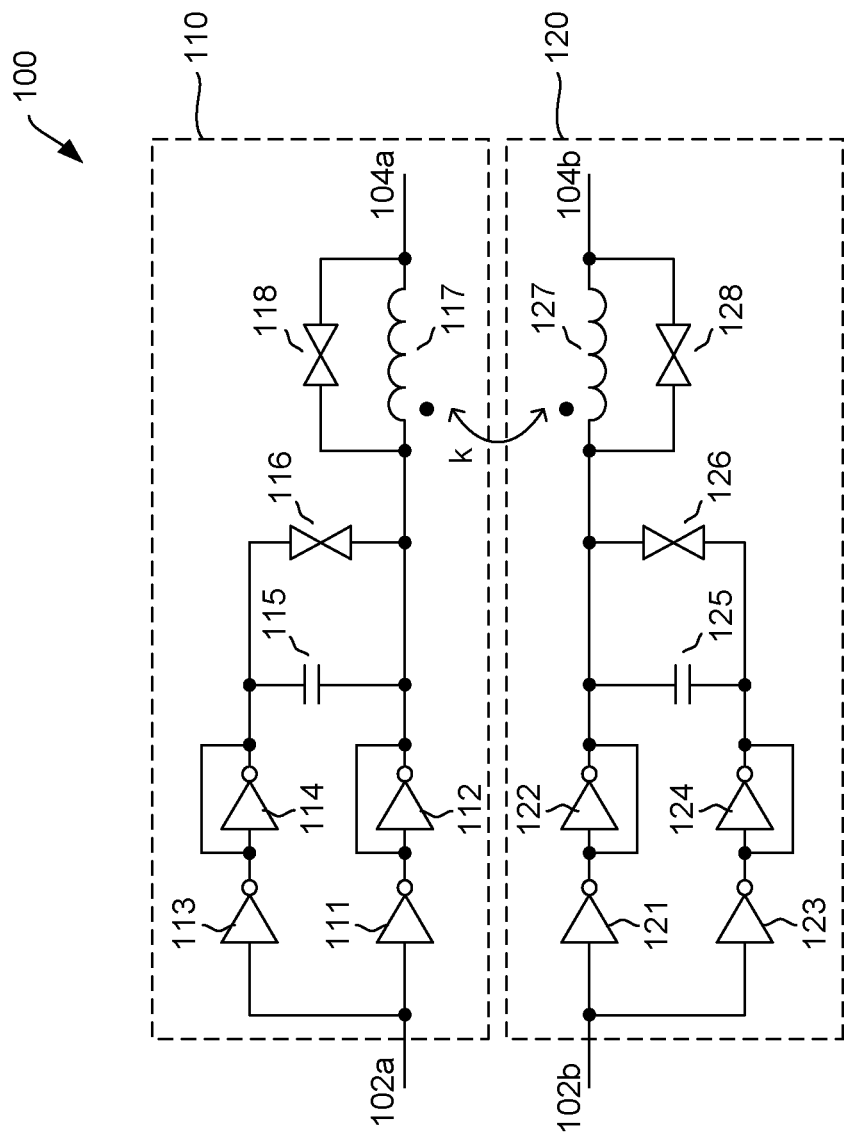
FIG. 1 illustrates a circuit diagram of continuous time linear circuitry in accordance with some embodiments of the present disclosure.

Aspects of the present disclosure relate to a continuous time linear equalizer with programmable inductive high frequency boost.

Wireline (and wireless) communication systems include a transmitter device that outputs (e.g., transmits) a signal to a receiver device. The transmitter device and receiver device are connected via a channel. The receiver circuitry includes analog to digital (ADC) circuitry that converts the received signal from the analog domain to the digital domain. Digital signal processing circuitry of the receiver circuitry performs the majority of the filtering and processing within the digital domain, which simplifies the requirements of the analog front-end circuitry of the receiver circuitry.

A gain of the continuous time linear equalizer (CTLE) circuitry of the analog front-end circuitry is between 10 dB and 20 dB at the Nyquist frequency. With ever-increasing baud rates, generating analog gain at the Nyquist frequency increases in difficulty as the unity gain frequency of the transistor technologies used to form the receiver circuitry is not substantially higher than the Nyquist frequency. Furthermore, the unity gain frequency of the transistors is not increasing fast enough to handle the increasing Nyquist frequencies at higher data rates. Accordingly, new CTLE circuit techniques are needed.

In many instances, ultra-high bandwidth (e.g., a frequency of about 50 GHz or more) circuit topologies are incorporated within the receiver circuitry to mitigate the gain-bandwidth issue. However, the ultra-high bandwidth circuit topologies increase the circuit area and manufacturing cost of the receiver device. In addition to the bandwidth requirement, the CTLE circuitry provides configurability to accommodate for a wide range of different channels. However, the configurability increases the circuitry complexity, increasing the level of difficulty to design analog front-end circuitry that achieves the bandwidth requirements.

The CTLE circuitry described herein includes gain circuits, inductors, capacitors, and programmable resistive elements to provide the configurability to accommodate various different channels. The inductor of the CTLE circuitry described herein forms a passive resonator with a following stage. A programmable resistive element is placed in parallel with the inductor. By varying the resistance value of the programmable resistive element, the high frequency gain of the CLTE circuitry is varied. Furthermore, the ratio of the gain of the inverters of the gain circuits to their loads and/or the resistance value of a programmable resistive element connected to the output of the gain circuits can be varied to vary the DC gain and/or an intermediate frequency gain (e.g., a frequency between a zero pole and the high frequency of the CTLE circuitry.

Technical advantages of the present disclosure include, but are not limited to, CTLE circuitry that provides high bandwidth gain and frequency programmability to support different channels. The CTLE circuitry described herein supports communication systems with a data rate of up to about 224 Gbps, or higher. Furthermore, the CTLE circuitry described herein is compatible with digital complementary metal-oxide semiconductor (CMOS) processes, reducing the design complexity and manufacturing cost of the corresponding receiver circuitry as costly analog processing steps may be omitted.

FIG. 1 illustrates a circuit diagram of CTLE circuitry 100, according to one or more examples. The CTLE circuitry 100 is fully differential. The CTLE circuitry 100 receives the input signal 102 and outputs the output signal 104. The input signal 102 is a differential signal that includes the input signal 102a and the input signal 102b. The input signal 102a has a different polarity from the input signal 102b. In one example, the input signal 102a is a positive signal and the input signal 102b is a negative signal. The output signal 104 is a differential signal that includes the output signal 104a and the output signal 104a. The output signal 104a has a different polarity from the output signal 104b. In one example, the output signal 104a is a positive signal and the output signal 104b is a negative signal.

The CTLE circuitry 100 applies a voltage gain to the input signal 102 at one or more frequencies. In one example, the CTLE circuitry 100 applies a high frequency voltage gain to the input signal 102. High frequency is 50 GHz. In other examples, the high frequency is less than or greater than 50 GHz. Further, the CTLE circuitry 100 may apply a DC voltage gain to the input signal 102. In other examples, the CTLE circuitry 100 applies an intermediate frequency voltage gain to the input signal 102. The intermediate frequency is a frequency between a zero frequency and the high frequency.

The CTLE circuitry 100 generates a voltage gain established by transconductance stages terminated by diode connected devices. The voltage gain is voltage and temperature independent. The voltage gain is based on the product of the transconductance and the diode impedance (e.g., $g_m/g_{md}$). As is described in greater detail in the following, the transconductance and the diode connected devices are implemented as inverters. The inverters are generated by n-channel MOS (NMOS) transistors and p-channel MOS (PMOS) transistors.

The CTLE circuitry 100 includes first path circuitry 110 and second path circuitry 120. The first path circuitry 110 receives the input signal 102a and outputs the output signal 104a. The first path circuitry 110 includes inverters 111-114, capacitor 115, resistive elements 116 and 118, and inductor 117. The inverters 112 and 114 are feedback inverters (e.g., the output of each of the inverters 112 and 114 is connected to the input of each of the inverters 112 and 114).

The input of the inverter 111 receives the input signal 102a. The output of the inverter 111 is connected to the input of the inverter 112. The gain of the inverter 111 is $g_{m1}$.

The output of the inverter 112 is connected to the input of the inverter 112. Further, the output of the inverter 112 is connected to the capacitor 115, the resistive element 116, the resistive element 118, and the inductor 117. The gain of the inverter 112 is $g_{md1}$. The inverters 111 and 112 correspond to a first (or primary) gain stage.

The input of the inverter 113 receives the input signal 102a. The output of the inverter 113 is connected to the input of the inverter 114. The gain of the inverter 113 is $g_{m2}$.

The output of the inverter 114 is connected to the input of the inverter 114. Further, the output of the inverter 114 is connected to the capacitor 115 and the resistive element 116. The gain of the inverter 112 is $g_{md2}$. The inverters 113 and 114 correspond to a second (or secondary) gain stage.

The capacitor 115 is connected between the outputs of the inverters 112 and 114. The resistive element 116 is connected between the outputs of the inverters 112 and 114. Further, the capacitor 115 is connected in parallel with the resistive element 116.

The capacitor 115 has a capacitance value that corresponds to the data rate of the corresponding communication system. In one example for a data rate of about 224 Gbps, the capacitor 115 has a capacitance value of 200 fF. The capacitor 115 is formed via low resistivity front-end metallization layers. The metal layers may also be used within power delivery networks.

The resistive element 116 has a programmable resistance (e.g., a variable resistance). In one example, the programmable resistance includes a range of resistance values. The range of resistance values is from about 50 ohms to a resistance value that configures the resistive element 116 to function substantially similar to an open circuit. In other examples, the low resistance value of the range may be less than or greater than 50 ohms. In one example, the resistive element 116 includes one or more variable resistors. In other examples, the resistive element 116 is a transmission gate or gates, each including one or more transistors. Two of the transistors of the transmission gate are connected in parallel with each other. Further, in an example where multiple transmission gates are used to form the resistive element 116, the transmission gates are connected in parallel. In one example, the resistance of the resistance element 116 is varied by varying the voltage signal applied to the transistors.

The inductor 117 has an inductance value of that corresponds to the data rate of the corresponding communication system. In one example for a data rate of 224 Gbps, the inductor 117 has an inductance value of 100 pH. The input of the inductor 117 is connected to the output of the inverter 112, the capacitor 115, and the resistive element 116. Further, the resistance element 118 forms a feedback path between the output and the input of the inductor 117. The output signal 104a is output from an output of the inductor 117. The inductor 117 is formed via low resistivity front-end metallization layers. The metal layers may also be used within power delivery networks.

The resistive element 118 has a programmable resistance (e.g., a variable resistance). In one example, the programmable resistance includes a range of resistance values. The range of resistance values is from about 50 ohms to a resistance value that configures the resistive element 118 to function substantially similar to an open circuit. In other examples, the low resistance value of the range may be less than or greater than 50 ohms. In one example, the resistive element 118 includes one or more variable resistors. In other examples, the resistive element 118 is a transmission gate or gates, each including one or more transistors. Further, in an example where multiple transmission gates are used to form the resistive element 118, the transmission gates are connected in parallel. Two of the transistors of the transmission gate are connected in parallel with each other. In one example, the resistance of the resistance element 118 is varied by varying the voltage signal applied to the transistors.

In one example, the inverters 111-114 are formed with NMOS and PMOS transistors. In such an example, the common mode voltage input of the inverters 111-114 is approximately half the supply voltage such that the voltage headroom is divided between the NMOS and PMOS transistors of the inverters 111-114. Accordingly, the gain stages associated with the inverters 111-114 provides an increased gain while mitigating distortion.

The second path circuitry 120 receives the input signal 102b and outputs the output signal 104b. The second path circuitry 120 includes inverters 121-124, capacitor 125, resistive elements 126 and 128, and inductor 127. The inverters 122 and 124 are feedback inverters (e.g., the output of each of the inverters 122 and 1214 is connected to the input of each of the inverters 122 and 124). The inverters 121 and 122 correspond to a first gain stage and the inverters 123 and 124 correspond to a second gain stage.

The input of the inverter 121 receives the input signal 102b. The output of the inverter 121 is connected to the input of the inverter 122. The gain of the inverter 111 is $g_{m1}$.

The output of the inverter 122 is connected to the input of the inverter 122. Further, the output of the inverter 122 is connected to the capacitor 125, the resistive element 126, the resistive element 128, and the inductor 127. The gain of the inverter 122 is $g_{md1}$.

The input of the inverter 123 receives the input signal 102b. The output of the inverter 123 is connected to the input of the inverter 124. The gain of the inverter 123 is $g_{m2}$.

The output of the inverter 124 is connected to the input of the inverter 124. Further, the output of the inverter 124 is connected to the capacitor 125 and the resistive element 126. The gain of the inverter 122 is $g_{md2}$.

The capacitor 125 is connected between the outputs of the inverters 122 and 124. The resistive element 126 is connected between the outputs of the inverters 122 and 124. Further, the capacitor 125 is connected in parallel with the resistive element 126.

The capacitor 125 has a capacitance value that corresponds to the data rate of the corresponding communication system. In one example for a data rate of 224 Gbps, the capacitor 115 has a capacitance value of 200 fF. The capacitor 125 is formed via low resistivity front-end metallization layers. The metal layers may also be used within power delivery networks.

The resistive element 126 has a programmable resistance (e.g., a variable resistance). In one example, the programmable resistance includes a range of resistance values. The range of resistance values is from about 50 ohms to a resistance value that configures the resistive element 126 to function substantially similar to an open circuit. In other examples, the low resistance value of the range may be less than or greater than 50 ohms. In one example, the resistive element 126 includes one or more variable resistors. In other examples, the resistive element 126 is a transmission gate or gates, each including one or more transistors. Further, in an example where multiple transmission gates are used to form the resistive element 126, the transmission gates are connected in parallel. Two of the transistors of the transmission gate are connected in parallel with each other. In one example, the resistance of the resistance element 126 is varied by varying the voltage signal applied to the transistors.

The inductor 127 has an inductance value that corresponds to the data rate of the corresponding communication system. In one example for a data rate of 224 Gbps, the inductor 117 has an inductance value of 100 pH. The input of the inductor 127 is connected to the output of the inverter 122, the capacitor 125, and the resistive element 126. Further, the resistance element 128 forms a feedback path between the output and the input of the inductor 127. The output signal 104b is output from an output of the inductor 127. The inductor 127 is formed via low resistivity front-end metallization layers. The metal layers may also be used within power delivery networks.

The resistive element 128 has a programmable resistance (e.g., a variable resistance). In one example, the programmable resistance includes a range of resistance values. The range of resistance values is from about 50 ohms to a resistance value that configures the resistive element 128 to function substantially similar to an open circuit. In other examples, the low resistance value of the range may be less than or greater than 50 ohms. In one example, the resistive element 128 includes one or more variable resistors. In other examples, the resistive element 128 is a transmission gate or gates, each including one or more transistors. Furthermore, in an example where multiple transmission gates are used to form the resistive element 128, the transmission gates are connected in parallel. Two of the transistors of the transmission gate are connected in parallel with each other. In one example, the resistance of the resistance element 128 is varied by varying the voltage signal applied to the transistors.

In one or more examples, the CTLE circuitry 100 boosts the high frequency components of the input signal 102. In one example, the CTLE circuitry 100 applies more gain to the high frequency components of the input signal 102 than to the other frequency components of the input signal 102. The inductors 117 and 127 form a passive resonator with the capacitance of the next stage (e.g., a circuit element) connected to the output of the CTLE circuitry 100. The signal boost applied to the input signal via the CTLE circuitry 100 is proportional to the quality factor of the passive resonator. The quality factor corresponds to the amount of resistance loss within the CTLE circuitry 100. In one example, varying the resistance value of the resistance elements 118 and 128 varies the high frequency gain of the CTLE circuitry 100.

In one example, the DC gain of the CTLE circuitry 100 corresponds to the ratio of $g_{m1}$ to $g_{md1}$ as illustrated in equation 1.

$$A_{DC} = \frac{g_{m1}}{g_{md1}} \qquad \text{Equation 1}$$

At DC, the capacitors 115 and 125 isolate inverters 113, 114, 123, and 124 and the corresponding gains $g_{m2}$ and $g_{md2}$. In one example, the DC gain is varied by varying the resistance value of the resistive elements 116 and 126. For example, decreasing the resistance value of the resistance elements 116 and 126 increases the DC gain of the CTLE circuitry 100. For example, as is shown in the waveform 200 of FIG. 2, the DC gain is varied from $A_{DCR}$ to $A_{DC}$ based on the resistance value of the resistive elements 116 and 126. The gain $A_{DCR}$ is defined by equation 2.

$$A_{DCR} = A_{DC} \cdot \frac{1 + \frac{g_{m2}}{g_{m1}} + g_{md2} \cdot R_c}{1 + \frac{g_{md2}}{g_{md1}} + g_{md2} \cdot R_c} \qquad \text{Equation 2}$$

In equation 2, $R_C$ is the resistance value of the resistive elements 116 and 126.

Figure 2:
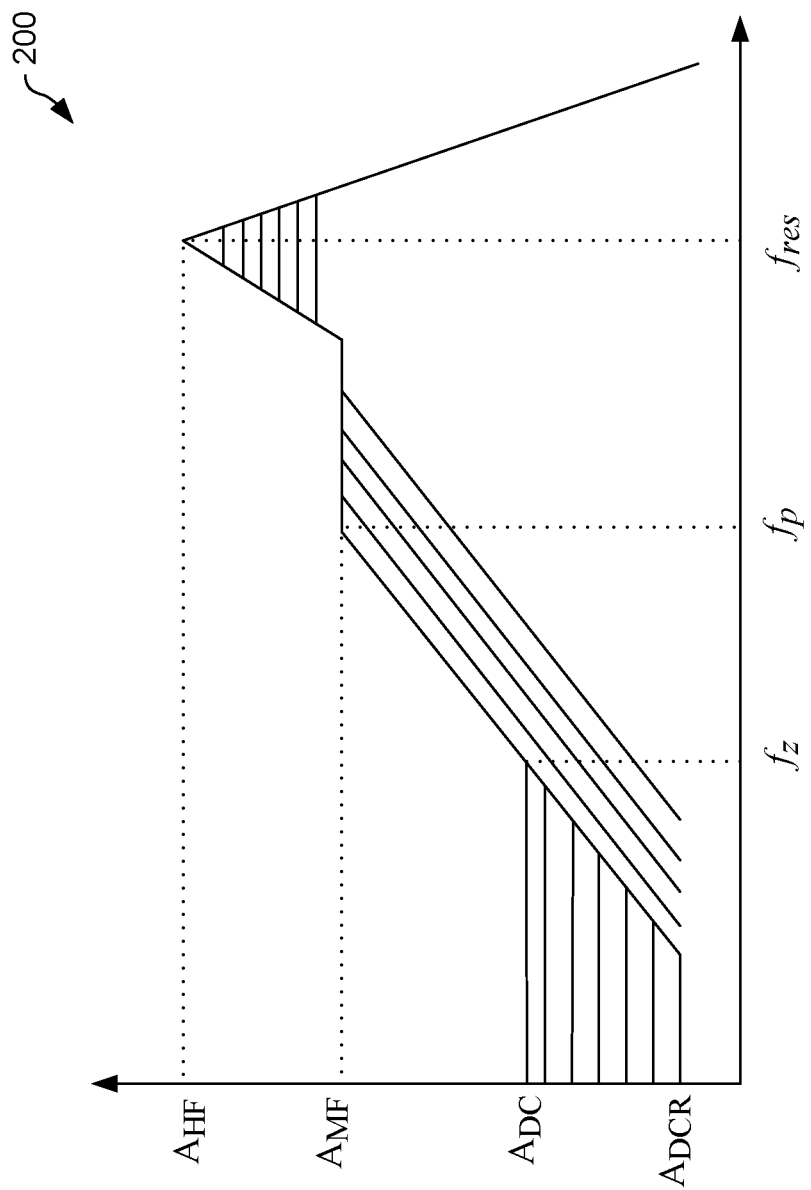
FIG. 2 illustrates a waveform of example gains in accordance with some embodiments of the present disclosure.

In the waveform 200 of FIG. 2, the high frequency gain is $A_{HF}$ and the intermediate frequency gain is $A_{MF}$. The high frequency is $f_{res}$ and the intermediate frequency is $f_p$. In one example, the intermediate frequency $f_p$ is between the zero frequency $f_z$ and the high frequency $f_{res}$. In one example, the crossover frequency between DC gain ($A_{DC}$) and the medium frequency $A_{MF}$ is defined by the pool zero/pole frequency pair $f_z$ and $f_p$. The frequencies f and $f_p$ can be adjusted by adjusting the diode impedance $1/g_{md2}$. In one example, multiple parallel inverters of the inverters 112, 114, 122, 124 are activated to control the impedance, moving the zero/pole frequencies. In such an example, the gain $g_{md2}$ is adjusted by varying the activated parallel inverters of the inverters 112, 114, 122, 124.

The gain $A_{MF}$ corresponds to the ratio of $g_{m1}$ and $g_{m2}$ to $g_{md1}$ and $g_{md2}$, and as illustrated by equation 3.

$$A_{MF} = \frac{g_{m1} + g_{m2}}{g_{md1} + g_{md2}} \qquad \text{Equation 3}$$

The gain $A_{HF}$ corresponds to the ratio of $g_{m1}$ and $g_{m2}$ to $g_{md1}$ and $g_{md2}$ (or the gain $A_{MF}$) multiplied by the quality factor Q of the inductors 117 and 127, as illustrated by equation 4. The quality factor Q is the ratio of the inductive reactance to the resistance of the inductor at a given frequency. The higher the quality factor Q, the closer the inductors 117 and 127 approaches the behavior of an ideal inductor. As is illustrated by Equation 4, as the quality factor Q increases and/or as the ratio of $g_{m1}$ and $g_{m2}$ to $g_{md1}$ and $g_{md2}$ (e.g., $A_{MF}$) increases, $A_{HF}$ increases.

$$A_{HF} = A_{MF} \cdot Q \qquad \text{Equation 4}$$

With further reference to FIG. 1, the frequency response of the CTLE circuitry 100 is defined by equation 5.

$$H_{CTLE}(s) = A_{MF} \cdot \frac{s + \omega_z}{s + \omega_p} \cdot \frac{\omega_{res}^2}{s^2 + s \cdot \frac{\omega_{res}}{Q} + \omega_{res}^2} \qquad \text{Equation 5}$$

In Equation 5, frequency $\omega_z$ is defined by equation 6.

$$\omega_z = \frac{g_{md2}}{C_c} \cdot \frac{g_{m1}}{g_{m1} + g_{m2}} + \frac{1}{R_C + C_c} \qquad \text{Equation 6}$$

In equation 5, frequency $\omega_p$ is defined by equation 7.

$$\omega_p = \frac{A_{MF}}{A_{DC}} \cdot \omega_z \qquad \text{Equation 7}$$

In equation 5, frequency $\omega_{res}$ is defined by equation 8. In equation 8, $C_{IN}$ is the load capacitance of the CTLE circuitry.

$$\omega_{res} = \sqrt{\frac{1}{L \cdot C_{IN}} \cdot \left(1 - \frac{1}{2 \cdot Q^2}\right)} \qquad \text{Equation 8}$$

Further, in equation 5, the quality factor Q is determined from equation 9.

$$\frac{1}{Q} = \frac{1}{Q_{ind}} + \frac{\omega_{res} \cdot L}{R_Q} + \frac{1}{\omega_{res} \cdot L \cdot (g_{md1} + g_{md2})} \qquad \text{Equation 9}$$

In equation 4, $R_Q$ is the resistance value of the resistive elements 118 and 128 of FIG. 1. The value of $Q_{ind}$ corresponds to the data rate of the corresponding CTLE circuitry. In one example, $Q_{ind}$ is about 10 for an inductor used in a 224 Gbps CTLE.

Figure 3:
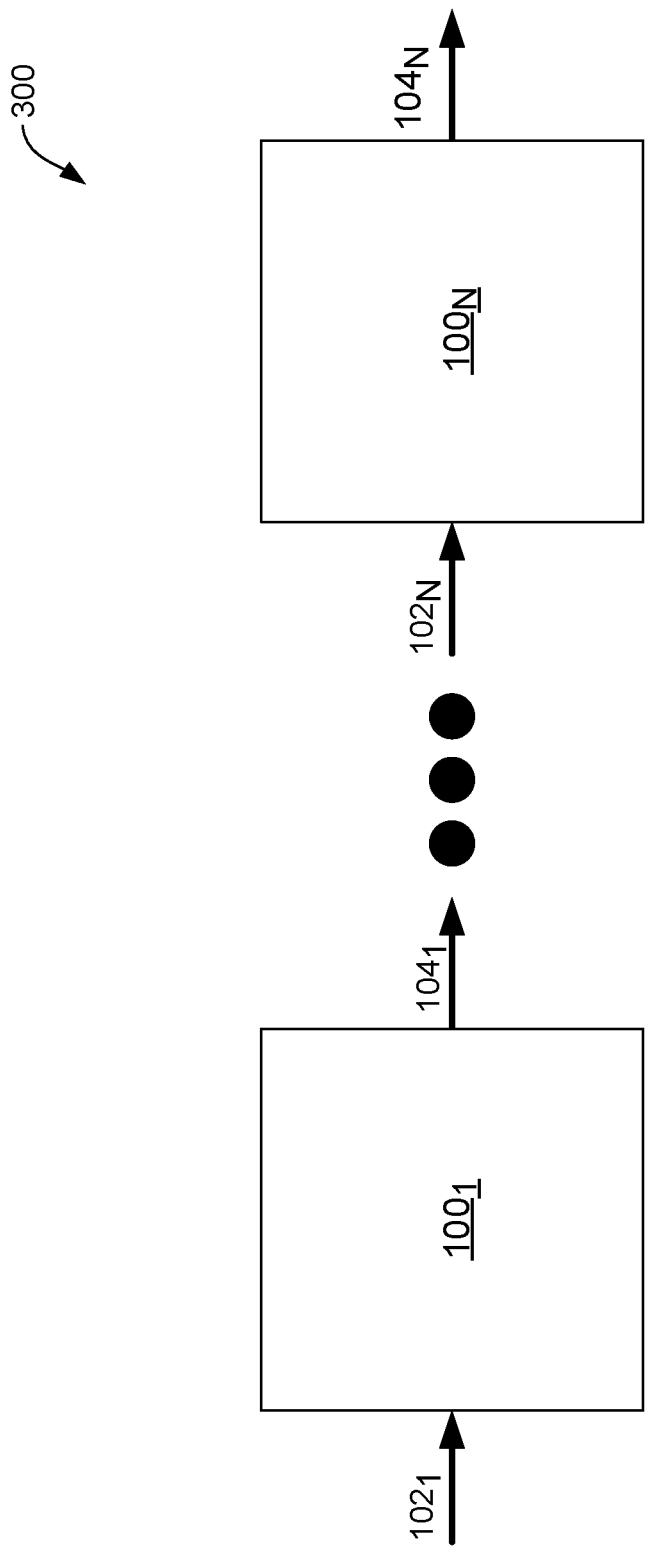
FIG. 3 illustrates a block diagram of a portion of analog front-end circuitry in accordance with some embodiments of the present disclosure.

FIG. 3 illustrates a block diagram of a communication system 300 that includes one or more CTLE circuitries 100. For example, the communication system 300 includes one or more of the CLTE circuitries 100₁-100ₙ. N is two or more. Each of the CTLE circuitries 100₁-100ₙ is configured similar to that of the CTLE circuitry 100 of FIG. 1. The output of each of the CTLE circuitries 100₁-100ₙ₋₁ is connected to the input of subsequent CTLE circuitry 100. Accordingly, the capacitance forming the passive LC resonator in each of the CTLE circuitries 100₁-100ₙ₋₁ is the capacitive load of the subsequent CTLE circuitry 100. In one example, the capacitance forming the passive LC resonator of the CTLE circuitry 100₁ is the capacitive of load of the CTLE circuitry 100₂, and the capacitance forming the passive LC resonator of the CTLE circuitry 100ₙ₋₁ is the capacitive load of the CTLE circuitry 100ₙ. The capacitance forming the LC resonator of the CTLE circuitry 100ₙ is a following circuit element of the communication system 300 (e.g., variable gain amplifier (VGA) circuitry, analog to digital converter ($A_{DC}$) circuitry, or signal processing circuitry, among others).

The CTLE circuitry 100₁ receives the input signal 102₁ and outputs the output signal 104₁. The CTLE circuitry 100ₙ receives the input signal 102ₙ and outputs the output signal 104ₙ. In one example, the input signal 102ₙ is the output signal 104₁.

In one or more examples, the CTLE circuitries 100₁-100ₙ have a common high frequency gain $A_{HF}$, DC gain $A_{DCR}$, and/or intermediate frequency gain $A_{MF}$. In other examples, at least two of the CTLE circuitries 100₁-100ₙ differ in at least one of a high frequency gain $A_{HF}$, DC gain $A_{DCR}$, or intermediate frequency gain $A_{MF}$. In one or more examples, the capacitance value Cc, the resistance value $R_C$, and/or the resistance value Ro is the same within at least two of the CTLE circuitries 100₁-100ₙ. In another example, the capacitance value Cc, the resistance value $R_C$, and the resistance value Ro differ in at least two of the of the CTLE circuitries 100₁-100ₙ.

Figure 4:
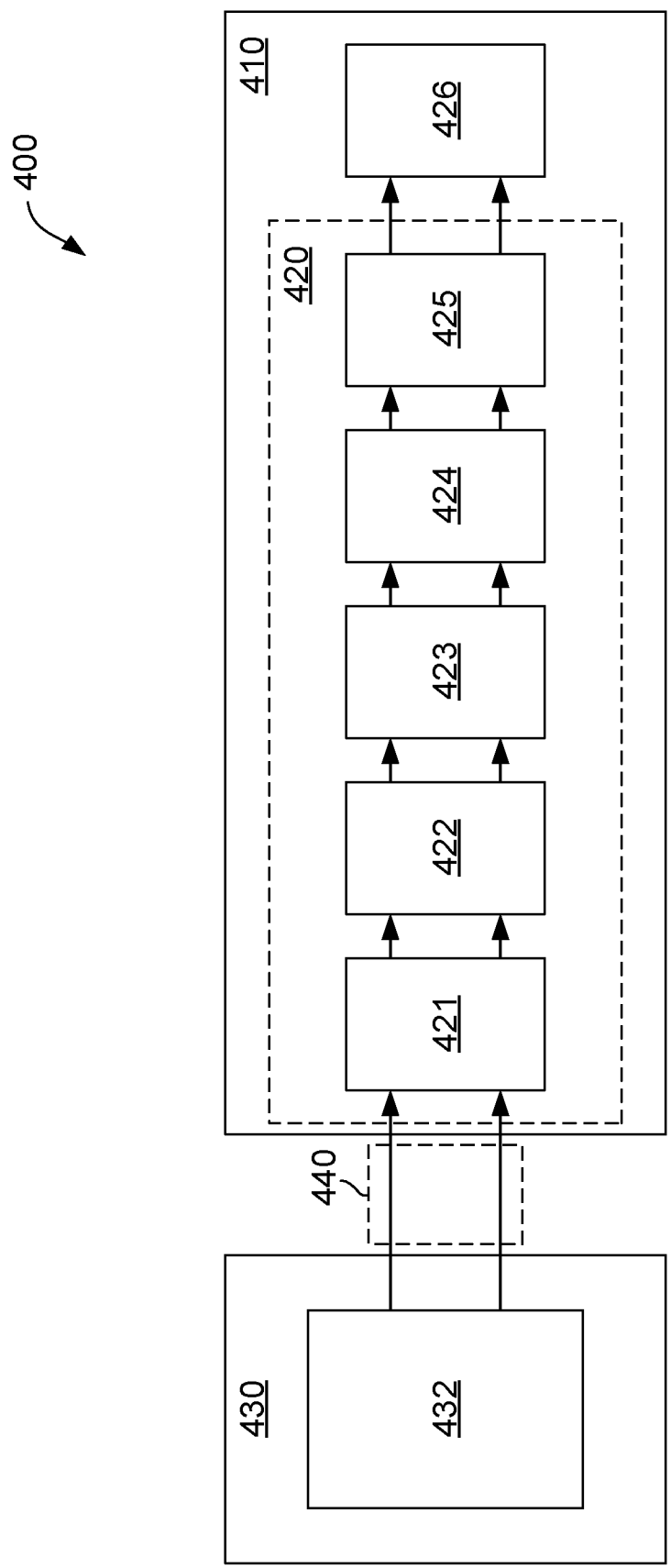
FIG. 4 illustrates a block diagram of a communication system in accordance with some embodiments of the present disclosure.

FIG. 4 illustrates a block diagram of a communication system 400. The communication system includes receiver device 410 and transmitter device 430. In one example, the communication system 400 is a serializer/deserializer (SerDes) communication system. The data rate of the communication system 400 is about 224 Gbps or more. In one example, the data rate of the communication system 400 is 224 Gbps. In other examples, the data rate of the communication system 400 is less than 200 Gbps.

The transmitter device 430 is connected to the receiver device 410 via the channel 440. The channel 440 includes one or more wires. In another example, the channel 440 is a wireless transmission medium. The transmitter device 430 transmits a signal (e.g., a differential signal) to the receiver device 410 via the channel 440. The transmitted signal includes one or more data symbols. In one example, the transmitter device 430 includes transmitter circuitry 432 that transmits a signal to the receiver device 410. In one or more examples, the transmitter device 430 includes one or more integrated circuit (IC) devices.

The receiver device 410 receives the signal from the transmitter device 430 via the channel 440. The receiver device 410 includes one or more IC devices. Further, the receiver device 410 includes analog front-end circuitry 420 and signal processing circuitry 426. The analog front-end circuitry 420 includes termination circuitry 421, CTLE circuitry 422, CTLE circuitry 423, VGA circuitry 424, and VGA circuitry 425. In other examples, the analog front-end circuitry 420 includes other circuit elements not shown in FIG. 4, and/or omits one or more of the circuit elements illustrated in FIG. 4.

The termination circuitry 421 receives the signal transmitted by the transmitter circuitry 431 via the channel 440. The termination circuitry 421 matches the input impedance of the receiver device 410 with the impedance of the channel 440, mitigating channel reflections. The CTLE circuitry 422 receives the output of the termination circuitry 421, and the CTLE circuitry 423 receives the output of the CTLE circuitry 422. The CTLE circuitry 422 and the CTLE circuitry 423 are configured similar to the CTLE circuitry 100 of FIG. 1. In one or more examples, the analog front-end circuitry 420 includes additional CTLE circuitry.

The output of the CTLE circuitry 423 is received by the VGA circuitry 424, and the output of the VGA circuitry 425 is received by the signal processing circuitry 426. The VGA circuitry 424 and the VGA circuitry 425 each have a gain that varies based on a corresponding control. The signal processing circuitry 426 includes $A_{DC}$ circuitry, data slicer circuitry, and/or other types of signal processing circuitry that is able to extract digital symbols from the received analog signal.

In one example, the bandwidth of the channel 440 is limited, which reduces the signal to noise ratio of the signal received by the receiver device 410. Accordingly, extracting data symbols with a low error rate is difficult. The analog front-end circuitry 420 mitigates the signal degradation imposed by the channel 440. In one or more examples, the analog front-end circuitry 420 including the CTLE circuitry 422 and/or 423 mitigates the signal degradation within the received signal, improving the signal to noise ratio at the signal processing circuitry 426, and improving the ability of the signal processing circuitry 426 to extract the data signals from the received with low error rate. The analog front-end circuitry 420 improves the signal quality of the received signal by cascaded stages of CTLE circuitries 422 and 423, and the VGA circuitry 424 and 425. The amount of high frequency gain and high frequency signal boost provided by the analog front-end circuitry 420 depends on factors such as the channel 440 and/or the symbol error rate of the signal processing circuitry 426.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A continuous time linear equalizer circuitry comprising:
    first gain circuitry and second gain circuitry configured to receive an input signal;
    a first capacitor connected between an output of the first gain circuitry and an output of the second gain circuitry;
    a first resistive element connected between the output of the first gain circuitry and the output of the second gain circuitry;
    a first inductor connected to the output of the first gain circuitry, the first capacitor, and the first resistive element; and
    a second resistive element connected in parallel with the first inductor.

2. The continuous time linear equalizer circuitry of claim 1, wherein a resistance value of the first resistive element is programmable.

3. The continuous time linear equalizer circuitry of claim 1, wherein a resistance value of the second resistive element is programmable.

4. The continuous time linear equalizer circuitry of claim 1, wherein the first gain circuitry comprises:
    a first inverter configured to receive the input signal; and
    a second inverter connected to the output of the first inverter, wherein an output of the second inverter is connected to an input of the second inverter via a feedback path, and wherein the second gain circuitry comprises:
    a third inverter configured to receive the input signal; and
    a fourth inverter connected to the output of the third inverter, wherein an output of the fourth inverter is connected to an input of the fourth inverter via a feedback path.

5. The continuous time linear equalizer circuitry of claim 1, wherein:
    third gain circuitry and fourth gain circuitry configured to receive the input signal;
    a second capacitor connected between an output of the third gain circuitry and an output of the fourth gain circuitry;
    a third resistive element connected between the output of the third gain circuitry and the output of the fourth gain circuitry;
    a second inductor connected to the output of the third gain circuitry, the second capacitor, and the third resistive element; and
    a fourth resistive element connected in parallel with the second inductor.

6. The continuous time linear equalizer circuitry of claim 5, wherein a resistance value of the third resistive element is programmable, and a resistance value of the fourth resistive element is programmable.

7. The continuous time linear equalizer circuitry of claim 5, wherein the third gain circuitry comprises:
    a fifth inverter configured to receive the input signal; and
    a sixth inverter connected to the output of the fifth inverter, wherein an output of the fifth inverter is connected to an input of the fifth inverter via a feedback path, and wherein the fourth gain circuitry comprises:
a seventh inverter configured to receive the input signal; and
an eighth inverter connected to the output of the seventh inverter, wherein an output of the eighth inverter is connected to an input of the eighth inverter via a feedback path.

8. An analog front-end circuitry comprising:
first continuous time linear equalizer circuitry comprising:
first gain circuitry and second gain circuitry configured to receive an input signal;
a first capacitor connected between an output of the first gain circuitry and an output of the second gain circuitry;
a first resistive element connected between the output of the first gain circuitry and the output of the second gain circuitry;
a first inductor connected to the output of the first gain circuitry, the first capacitor, and the first resistive element; and
a second resistive element connected in parallel with the first inductor.

9. The analog front-end circuitry of claim 8, wherein a resistance value of the first resistive element is programmable, and a resistance value of the second resistive element is programmable.

10. The analog front-end circuitry of claim 8, wherein the first gain circuitry comprises:
a first inverter configured to receive the input signal; and
a second inverter connected to the output of the first inverter, wherein an output of the second inverter is connected to an input of the second inverter via a feedback path, and wherein the second gain circuitry comprises:
a third inverter configured to receive the input signal; and
a fourth inverter connected to the output of the third inverter, wherein an output of the fourth inverter is connected to an input of the fourth inverter via a feedback path.

11. The analog front-end circuitry of claim 8, wherein the first continuous time linear equalizer circuitry further comprises:
third gain circuitry and fourth gain circuitry configured to receive the input signal;
a second capacitor connected between an output of the third gain circuitry and an output of the fourth gain circuitry;
a third resistive element connected between the output of the third gain circuitry and the output of the fourth gain circuitry;
a second inductor connected to the output of the third gain circuitry, the second capacitor, and the third resistive element; and
a fourth resistive element connected in parallel with the second inductor.

12. The analog front-end circuitry of claim 11, wherein a resistance value of the third resistive element is programmable, and a resistance value of the fourth resistive element is programmable.

13. The analog front-end circuitry of claim 11, wherein the third gain circuitry comprises:
a fifth inverter configured to receive the input signal; and
a sixth inverter connected to the output of the fifth inverter, wherein an output of the fifth inverter is connected to an input of the fifth inverter via a feedback path, and wherein the fourth gain circuitry comprises:
a seventh inverter configured to receive the input signal; and
an eighth inverter connected to the output of the seventh inverter, wherein an output of the eighth inverter is connected to an input of the eighth inverter via a feedback path.

14. The analog front-end circuitry of claim 8 further comprising second continuous time linear equalizer circuitry comprising an input connected to an output of the first continuous time linear equalizer circuitry.

15. The analog front-end circuitry of claim 14, wherein the second continuous time linear equalizer circuitry further comprises:
fifth gain circuitry and sixth gain circuitry configured to receive an output signal of the first continuous time linear equalizer circuitry;
a third capacitor connected between an output of the fifth gain circuitry and an output of the sixth gain circuitry;
a fifth resistive element connected between the output of the fifth gain circuitry and the output of the sixth gain circuitry;
a third inductor connected to the output of the fifth gain circuitry, the third capacitor, and the fifth resistive element; and
a sixth resistive element connected in parallel with the third inductor.

16. A communication system comprising:
a transmitter device configured to output a first signal; and
a receiver device configured to receive the first signal from the transmitter device, the receiver device comprising analog front-end circuitry, the analog front-end circuitry comprising first continuous time linear equalizer circuitry comprising:
first gain circuitry and second gain circuitry configured to receive an input signal;
a first capacitor connected between an output of the first gain circuitry and an output of the second gain circuitry;
a first resistive element connected between the output of the first gain circuitry and the output of the second gain circuitry;
a first inductor connected to the output of the first gain circuitry, the first capacitor, and the first resistive element; and
a second resistive element connected in parallel with the first inductor.

17. The communication system of claim 16, wherein the first gain circuitry comprises:
a first inverter configured to receive the input signal; and
a second inverter connected to the output of the first inverter, wherein an output of the second inverter is connected to an input of the second inverter via a feedback path, and wherein the second gain circuitry comprises:
a third inverter configured to receive the input signal; and
a fourth inverter connected to the output of the third inverter, wherein an output of the fourth inverter is connected to an input of the fourth inverter via a feedback path, and wherein a resistance value of the first resistive element is programmable, and a resistance value of the second resistive element is programmable.

18. The communication system of claim 16, wherein the first continuous time linear equalizer circuitry further comprises:
- third gain circuitry and fourth gain circuitry configured to receive the input signal;
- a second capacitor connected between an output of the third gain circuitry and an output of the fourth gain circuitry;
- a third resistive element connected between the output of the third gain circuitry and the output of the fourth gain circuitry;
- a second inductor connected to the output of the third gain circuitry, the second capacitor, and the third resistive element; and
- a fourth resistive element connected in parallel with the second inductor.

19. The communication system of claim 18, wherein the third gain circuitry comprises:
- a fifth inverter configured to receive the input signal; and
- a sixth inverter connected to the output of the fifth inverter, wherein an output of the fifth inverter is connected to an input of the fifth inverter via a feedback path, and wherein the fourth gain circuitry comprises:
  - a seventh inverter configured to receive the input signal; and
  - an eighth inverter connected to the output of the seventh inverter, wherein an output of the eighth inverter is connected to an input of the eighth inverter via a feedback path, and wherein a resistance value of the third resistive element is programmable, and a resistance value of the fourth resistive element is programmable.

20. The communication system of claim 19, wherein the receiver device further comprises a second continuous time linear equalizer circuitry further comprising:
- fifth gain circuitry and sixth gain circuitry configured to receive an output signal of the first continuous time linear equalizer circuitry;
- a third capacitor connected between an output of the fifth gain circuitry and an output of the sixth gain circuitry;
- a fifth resistive element connected between the output of the fifth gain circuitry and the output of the sixth gain circuitry;
- a third inductor connected to the output of the fifth gain circuitry, the third capacitor, and the fifth resistive element; and
- a sixth resistive element connected in parallel with the third inductor.

* * * * *